United States Patent
Haraguchi

(10) Patent No.: US 6,915,827 B2
(45) Date of Patent: Jul. 12, 2005

(54) OFFSET MEASURING MECHANISM AND OFFSET MEASURING METHOD IN A BONDING APPARATUS

(75) Inventor: Manabu Haraguchi, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/671,090

(22) Filed: Sep. 25, 2003

(65) Prior Publication Data
US 2004/0060663 A1 Apr. 1, 2004

(30) Foreign Application Priority Data
Sep. 30, 2002 (JP) ........................ 2002-286214

(51) Int. Cl.$^7$ .............................................. G05G 15/00
(52) U.S. Cl. ...................... 156/351; 156/358; 156/362; 156/378; 156/379; 29/833; 29/740
(58) Field of Search ......................... 29/832, 833, 834, 29/835, 836, 837, 838, 839, 840, 841, 740, 741, 742, 743; 156/358, 351, 378, 379, 362; 702/95; 700/254

(56) References Cited
U.S. PATENT DOCUMENTS
6,449,516 B1 * 9/2002 Kyomasu et al. ............ 700/58
6,678,058 B2 * 1/2004 Baldwin et al. ............ 356/609
2001/0042770 A1 * 11/2001 Hayata et al. ............... 228/4.1

FOREIGN PATENT DOCUMENTS
JP 2000-021923 1/2000
JP 2001-203234 7/2001

* cited by examiner

Primary Examiner—Chris Fiorilla
Assistant Examiner—George Koch
(74) Attorney, Agent, or Firm—Koda & Androlia

(57) ABSTRACT

An offset measuring mechanism and method used in a bonding apparatus, in which the object plane of a position detection camera is set on a hypothetical bonding working plane, and the image of imaging elements within the imaging plane is projected onto a bonding working plane. Furthermore, the tip end of a bonding tool is aligned with the bonding working plane. The object plane of the offset measuring camera is set on the bonding working plane, and the image on the bonding working plane is projected onto the imaging elements of the imaging plane of the offset measuring camera. The imaging elements detect the projected image of the imaging elements of the position detection camera or the image of the tip end of the bonding tool and output this data to the image position measuring part or tool position measuring section of the control block.

8 Claims, 8 Drawing Sheets

OFFSET MEASURING MECHANISM AND OFFSET MEASURING METHOD IN A BONDING APPARATUS

BACKGROUND OF THE INVENTION

1. Field of the Invention

The present invention relates to an offset measuring mechanism and an offset measuring method in a bonding apparatus and more particularly to an offset measuring mechanism and offset measuring method for measuring the offset between the position detection camera and bonding tool in a bonding apparatus.

2. Prior Art

In a wire bonding apparatus in which, for instance, a semiconductor device and a circuit board are connected by a fine wire, the bonding positions on the semiconductor device are detected by a position detection camera, and bonding work is performed by moving the bonding tool to these positions. In this case, if the bonding tool is disposed so that the axial center of the bonding tool coincides with the optical axis of the position detection camera, the visual field of position detection is blocked; ordinarily, therefore, the position detection camera and the bonding tool are disposed with a specified distance in between. This specified distance between the optical axis of the position detection camera and the axial center of the bonding tool is called an "offset", and is an important quantity which serves as a reference for positioning in the bonding work. However, this offset varies from instant to instant as a result of changes over time in the amount of radiant heat from the high-temperature bonding stage and the amount of heat generated in the optical system, etc., or in the amount of wear in the moving parts used for bonding, etc.

Japanese Patent No. 2982000 (Japanese Patent Application Laid-Open (Kokai) No. 2000-21923) discloses a method that determines the accurate amount of offset by a reference member, which is fixed with respect to the bonding apparatus, and an offset correction camera, which observes this reference member. More specifically, the optical axis of the position detection camera is first moved to a point above the reference member, and the relative positions of the reference member and position detection camera are measured. Next, the bonding tool is moved to a point above the reference member in accordance with a specified amount of offset, and the relative positions of the reference member and the bonding tool are measured by the offset correction camera. Then, the accurate amount of offset is determined by correcting the amount of offset on the bases of these measurement results.

On the other hand, Japanese Patent Application Laid-Open (Kokai) No. 2001-203234 discloses a method that makes it possible to measure the relative positions of a reference member and the bonding tool by means of a position detection camera, without using an offset correction camera. More specifically, instead of an offset correction camera, an optical system is constructed by optical elements such as laser diodes, half-mirrors and prisms, etc., and image light of the reference member and bonding tool is conducted to the position detection camera, and then the relative positions of the reference member and boding tool are measured by the position detection camera.

In the offset correction methods of the above-described prior arts, a reference member is provided, and the position of the position detection camera and the position of the bonding tool are respectively measured using the reference member as a reference, and the amount of offset is determined based upon these measurement results. Accordingly, the reference member is fixed in a reference position outside the position detection camera or offset correcting camera; and thus contamination of the reference member occurs. Furthermore, in order to obtain accurate measurements of the relative positions of the reference member and bonding tool, images of both the tip end of the bonding tool and the reference member must be clearly measured. Accordingly, the bonding tool must be caused to approach the reference member as closely as possible; and there is a danger that the bonding tool may collide with re reference member during this approach operation, thus damaging the reference member.

As seen from the above, in the prior art offset measuring methods, since the reference member used as a reference for position measurement is exposed to the outside, contamination and damage, etc. would occur in the reference member, and thus it is difficult to perform periodic offset measurements in a stable fashion.

Furthermore, since caution is required in the handling of the reference member, which is exposed to the outside, the degree of freedom regarding the disposition of the respective constituent elements of the bonding apparatus is limited.

SUMMARY OF THE INVENTION

Accordingly, the present invention is to solve the above-described problems encountered in the prior art.

The object of the present invention is to provide an offset measuring mechanism and offset measuring method in a bonding apparatus that make is possible to perform offset measurements in a stable fashion over a long period of time.

The above object is accomplished by a unique structure of the present invention for an offset measuring mechanism for measuring offset in a bonding apparatus that includes:

- a position detection camera that detects the position of a part to be bonded on a bonding working plane,
- a bonding tool that is disposed with an offset from the position detection camera, and
- a moving means for moving the position detection camera and the bonding tool as an integral unit on a plane parallel to the bonding working plane; and in the present invention, the offset measuring mechanism that measures the above-described offset comprises:

- an offset measuring camera which is disposed on an opposite side of the bonding working plane from the position detection camera and the bonding tool and which faces the bonding working plane,
- an imaging position measuring means which uses the moving means to move the position detection camera into a measurement range of the offset measuring camera and which determines a reference position of an imaging range in an imaging plane of the position detection camera based upon measurement of the imaging plane of the position detection camera by the offset measuring camera,
- a tool position measuring means which uses the moving means to move the bonding tool into the measurement range of the offset measuring camera and which measures a tool position of the bonding tool with the offset measuring camera, and
- an offset calculating means which calculates the offset based upon a measured value of the determined reference position of the imaging range and a measured value of the tool position.

In this structure, a reference position of the imaging range in the imaging plane of the position detection camera is determined based upon the measurement of the imaging plane of the position detection camera by the offset measuring camera, the tool position of the bonding tool is measured by the offset measuring camera, and the offset is calculated based upon these measured values. In other words, since the offset measuring camera is fixed with respect to the bonding apparatus, the measurement reference axes and measurement reference origin of this camera can be used as references.

Accordingly, by way of measuring, for instance, a reference position of the imaging range of the position detection camera with respect to the measurement plane, e.g., the reference point of the imaging plane, of the offset measuring camera and by measuring the tool position of the bonding tool, then the offset can be determined based upon these measurement results. Thus, the offset is calculated without using a reference member that is exposed to the outside and is thus in a danger of contamination or damage; and offset measurements can be performed in a stable fashion over a long period of time.

In the above structure, it is preferable that the position detection camera has a plurality of imaging elements disposed in two dimensions in the directions of mutually perpendicular element disposition axes which are associated with mutually perpendicular imaging reference axes of the imaging plane, and the reference position of the imaging range is a reference position of the two-dimensional disposition of the plurality of imaging elements.

A plurality of imaging elements disposed in two dimensions are used to determine the reference position of the imaging position; and since the plurality of imaging elements disposed in two dimensions have regularity in terms of shape and outline, etc., positions can easily be specified.

The above object is accomplished by another unique structure of the present invention for an offset measuring mechanism for measuring offset in a bonding apparatus that includes:

a position detection camera that detects the position of a part to be bonded on a bonding working plane, a bonding tool that is disposed with an offset from the position detection camera, and a moving means for moving the position detection camera and the bonding tool as an integral unit on a plane parallel to the bonding working plane; and in the present invention, the offset measuring mechanism that measure the above-described offset comprises:

a measurement reference member provided inside the position detection camera, the measurement reference member being disposed in a reference member disposition position that is associated with a reference position of the imaging range within the imaging plane of the position detection camera and that is in a different plane from the imaging plane of the position detection camera, and an image of the measurement reference member disposed in the reference member disposition position being projected toward the bonding working plane;

an offset measuring camera which is disposed on an opposite side of the bonding working plane from the position detection camera and the bonding tool and which faces the bonding working plane;

an imaging range measuring means which uses the moving means to move the position detection camera into a measurement range of the offset measuring camera and which determines the reference position of the imaging range of the position detection camera based upon measurement of the reference member disposition position the measurement reference member by the offset measuring camera;

a tool position measuring means which uses the moving means to move the bonding tool into the measurement range of the offset measuring camera and which measures a tool position of the bonding tool with the offset measuring camera; and an offset calculating means which calculates the offset based upon the determined reference position of the imaging range and a measured value of the tool position.

In the above structure, the measurement reference member is disposed in a reference member disposition position inside the position detection camera. Furthermore, an image of the member disposed in the reference member disposition position is projected toward the bonding working plane by the optical system of the position detection camera, and the reference member disposition position the measurement reference member is measured from this projected image by the offset measuring camera, thus determining the reference position of the imaging range of the position detection camera. Furthermore, the tool position of the bonding tool is measured by the offset measuring camera, and the offset is calculated based upon these measured values.

In other words, the offset measuring camera is fixed with respect to the bonding apparatus. Accordingly, by way of measuring, for instance, the position (the reference member disposition position) of the measurement reference member with respect to the reference point of the imaging plane with the use of the measurement reference axes or measurement reference origin as a reference and by measuring the tool position of the bonding tool, the offset can be determined based upon these measurement results. Accordingly, the offset can be calculated without using a reference member that is exposed to the outside and thus in a danger of contamination or damage, and offset measurements can be performed in a stable fashion over a long period of time.

It is preferable that the object plane of the position detection camera and the object plane of the offset measuring camera coincide. Here, the term "object plane" refers to the object plane in an optical system, and it indicates the plane where (it is assumed that) the object being observed will be disposed (when the optical system is designed). By way of disposing the object of observation on the object plane, observation with the highest precision can be accomplished. With the structure described above, the imaging plane of the position detection camera is projected with good precision on the object plane; and since the projected image is on the object plane of the offset measuring camera, this image is projected onto the imaging plane of the offset measuring camera with good precision. Consequently, the reference position of the imaging range of the position detection camera can be easily measured without using a special reference member that is exposed to the outside.

Furthermore, it is preferable that the offset measuring camera has an object side telecentric optical system, because with such a camera, stable position measurements can be performed even if the position of the object plane of the position detection camera or the position of the bonding tool fluctuates.

Furthermore, it is preferable that the offset measuring mechanism further includes an offset measuring camera magnification calculating means that: uses the moving means to move the bonding tool into the measurement range of the offset measuring camera and further to move the bonding tool within the measurement range, moves the bonding tool further in the measurement range so as to measure an amount of movement of an image of the bonding tool on the imaging plane of the offset measuring camera corresponding to the amount of movement, and calculates magnification of the offset measuring camera based upon an amount of movement of the bonding tool and an amount of movement of the image of the bonding tool.

With structure above, the actual magnification of the offset measuring camera can be determined based upon the measurement of the actual amount of movement of the bonding tool, rather than the nominal magnification of the offset measuring camera, so that the precision of the calculation of the offset can be improved.

It is also preferable that the offset measuring mechanism further includes a position detection camera magnification calculating means that: uses the moving means to move the bonding tool into a measurement range of the offset measuring camera, and calculates a magnification of the position detection camera based upon measurement of predetermined dimensions of the plurality of imaging elements by the offset measuring camera.

It is additionally preferable that the offset measuring mechanism further includes a position detection camera magnification calculating means that: uses the moving means to move the bonding tool into a measurement range of the offset measuring camera, and calculates a magnification of the position detection camera based upon measurement of predetermined dimensions of the measurement reference member by the offset measuring camera.

With the above structures, the actual magnification of the position detection camera can be determined based upon the measurement of the actual dimensions of the imaging elements or the actual dimensions of the measurement reference member, instead of the nominal magnification of the position detection camera, so that the precision of the calculation of the offset can be improved.

It is preferable that the offset measuring mechanism further includes an offset measuring camera inclination calculating means that: uses the moving means to move the bonding tool into the measurement range of the offset measuring camera and to further move the bonding tool within the measurement range, measures the movement direction of an image of the bonding tool on the imaging plane of the offset measuring camera corresponding to the movement relative to mutually perpendicular measurement reference axes on the imaging plane of the offset measuring camera, and calculates the relative inclination between movement reference axes of the moving means and measurement reference axes of the offset measuring camera based upon the movement direction of the bonding tool relative to mutually perpendicular movement reference axes of the moving means and the movement direction of an image of the bonding tool.

In this structure, the relative inclination between the movement reference axes of the moving means and the measurement reference axes of the offset measuring camera is determined based upon the measurement of the direction of the movement of the bonding tool that actually occurs in the actual bonding environment. Accordingly, the precision of the calculation of the offset can be improved.

It is additionally preferable that the offset measuring mechanism further includes a position detection camera inclination calculating means that: uses the moving means to move the position detection camera into the measurement range of the offset measuring camera, and calculates the relative inclination of imaging reference axes of the position detection camera and measurement reference axes of the offset measuring camera based upon measurement of inclination of the element disposition axes relative to mutually perpendicular measurement reference axes in the imaging plane of the offset measuring camera.

In this structure, the relative inclination between the imaging reference axes of the position detection camera and the measurement reference axes of the offset measuring camera is determined based upon the measurement of the inclination for the actually occurring element disposition axes of the imaging elements in the actual bonding environment, so that the precision of the calculation of the offset can be improved. In this case, the actually measured inclination for the element disposition axes of the imaging elements includes a component in which the element disposition axes of the imaging elements themselves are inclined with respect to the measurement reference axes of the offset measuring camera, and a component in which the imaging reference axes of the position detection camera themselves are twisted in the optical path between the imaging plane and the object plane, so that this inclination indicates the so-called comprehensive inclination of the imaging reference axes for the position detection camera.

The above object is further accomplished by a sequential set of unique steps of the present invention for an offset measuring method in a bonding apparatus that includes:

a position detection camera that detects the position of a part to be bonded on a bonding working plane, a bonding tool that is disposed with an offset from the position detection camera, a moving means for moving the position detection camera and the bonding tool as an integral unit on a plane parallel to the bonding working plane, and an offset measuring camera which is disposed on the opposite side of the bonding working plane from the position detection camera and the bonding tool and which faces the bonding working plane; and in the present invention, the offset measuring method that measures the above-described offset includes:

an imaging position measurement step fort moving, with a use of the moving means, the position detection camera into the measurement range of the offset measuring camera and measuring the reference position of the imaging range in an imaging plane of the position detection camera based upon observation of the imaging plane of the position detection camera by the offset measuring camera, a tool position measurement step for moving, with a use of the moving means, the bonding tool into the measurement range of the offset measuring camera and measuring the tool position of the bonding tool by the offset measuring camera, and an offset calculation step for calculating the offset based upon the measured value of the reference position of the imaging range and the measured value of the tool position.

The above object is further accomplished by another sequential set of unique steps of the present invention for an offset measuring method in a bonding apparatus that includes:

a position detection camera that detects the position of a part to be bonded on a bonding working plane, a bonding tool that is disposed with an offset from the position detection camera, a moving means for moving the position detection camera and the bonding tool as an integral unit on a plane parallel to the bonding working plane, and a measurement reference member provided inside the position detection camera, the measurement reference member being disposed in a reference member disposition position that is associated with a reference position of the imaging range within the imaging plane of the position detection camera and that is in a different plane from the imaging plane of the position detection camera, and the image of the measurement reference member disposed in the reference member disposition position being projected toward the bonding working plane, and an offset measuring camera which is disposed on the opposite side of the bonding working plane from the position detection camera and the bonding tool and which faces the bonding working plane; and in the present invention, the offset measuring method that measures the above-described offset includes:

an imaging range measurement step for moving, with a use of the moving means, the position detection camera into the measurement range of the offset measuring camera and measuring the reference position of the imaging range of the position detection camera based upon the observation of the reference member disposition position the measurement reference member by the offset measuring camera, a tool position measurement step for moving, with a use of the moving means, the bonding tool into the measurement range of the offset measuring camera and measuring the tool position of the bonding tool by the offset measuring camera, and an offset calculation step for calculating the offset based upon the measured value of the reference position of the imaging range and the measured value of the tool position.

DETAILED DESCRIPTION OF THE INVENTION

Embodiments of the present invention will be described in detail below with reference to the accompanying drawings.

Figure 1:
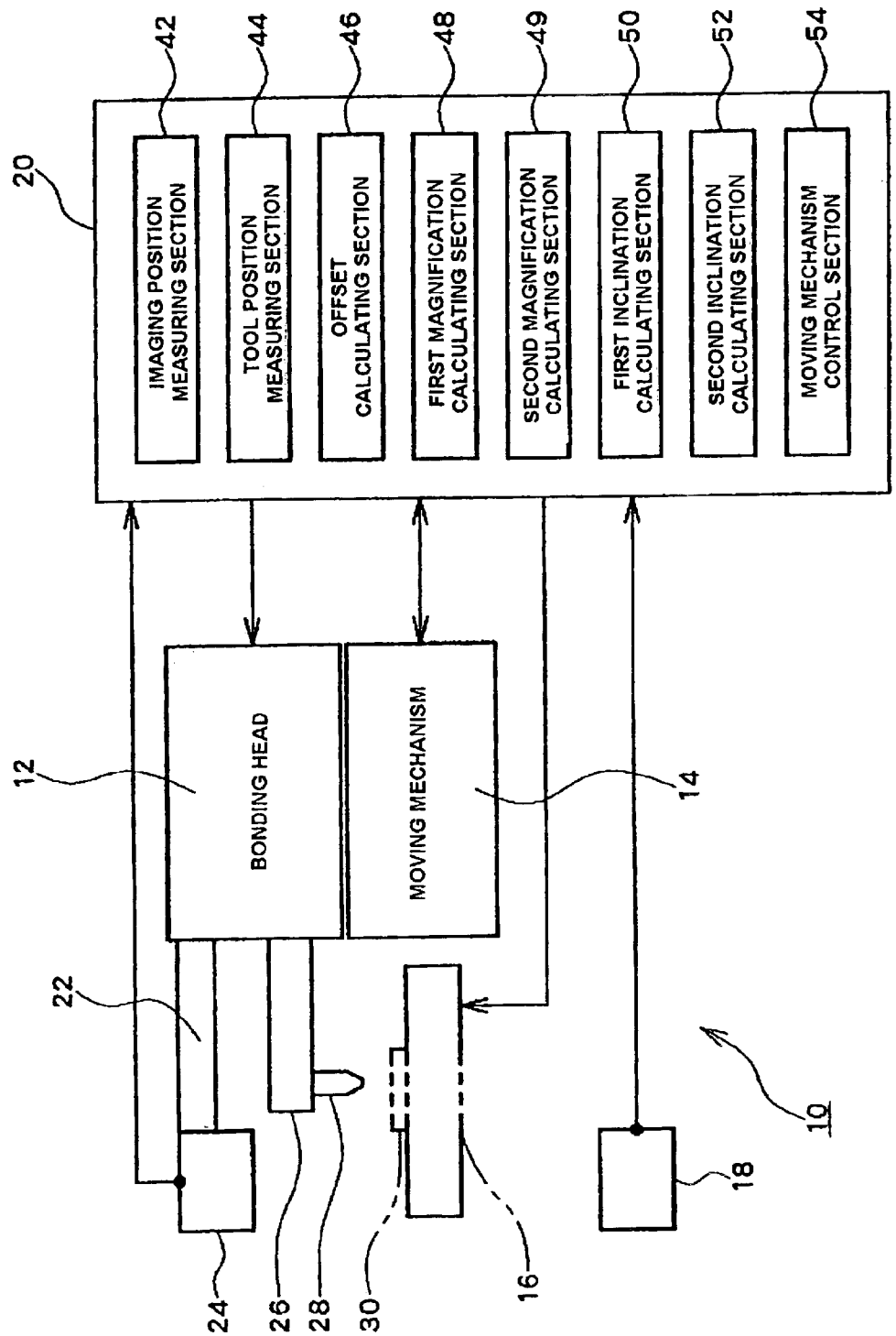
FIG. 1 is a block diagram of a bonding apparatus equipped with an offset adjustment mechanism according to the embodiment of the present invention.

In FIG. 1 is a block diagram of a bonding apparatus 10 equipped with an offset adjustment mechanism. In the following description, a wire bonding apparatus will be described as a bonding apparatus; however, the present invention is applicable to a bonding apparatus that does not use wires. In other words, the present invention can be used in, for instance, cases where, for example, a semiconductor device equipped with bumps and a lead frame are bonded by wireless bonding and where a semiconductor device and another part, e.g., another semiconductor device, etc. are bonded by die bonding under accurate positioning.

In FIG. 1, the bonding apparatus 10 comprises a bonding head 12, a moving mechanism 14 which moves the bonding head in the horizontal plane, a conveying mechanism 16 which conveys lead frames, etc., an offset measuring camera 18 which is used to measure the offset (described later), and a control block 20 which controls the respective constituent elements overall.

A position detection camera 24 is attached to the bonding head 12 via a camera holder 22, and a bonding tool 28 is attached via a bonding arm 26. The position detection camera 24 detects the positions of bonding locations on the object of bonding; and the object plane of this camera position detection camera 24 is set at the surface of the object of bonding. The bonding tool 28 is a tubular capillary which holds a slender wire that passes through this capillary. The bonding tool 28 can be moved in the vertical direction by the bonding arm 26. Bonding energy is supplied to the bonding tool 28 from an ultrasonic transducer (not shown in the drawings).

The position detection camera 24 and bonding tool 28 are disposed with an offset relative to each other. These elements are movable in the horizontal plane by the moving mechanism 14 as an integral unit with the bonding head 12 while this offset is maintained.

The conveying mechanism 16 mounts parts 30 that are to be bonded, such as lead frames on which LSI chips are die-bonded, etc., on a carrier; and it conveys these elements into a bonding working region beneath the bonding tool 28.

The control block 20 has the function of operating control of the respective constituent elements and can be constructed using a common computer. Besides the control of wire bonding for the parts 30 that are to be bonded, the control block 20 functions to calculate and correct the offset between the position detection camera 24 and the bonding tool 28.

For the purpose of executing offset calculation, the control block 20 is comprised of: an imaging position measuring section 42 which determines the reference position of the imaging plane of the position detection camera 24, a tool position measuring section 44 which determines the position of the bonding tool, an offset calculating section 46 which calculates and corrects the offset, a first magnification calculating section 48 which calculates the magnification of the offset measuring camera 18, a second magnification calculating section 49 which calculates the magnification of the position detection camera 24, a first inclination calculating section 50 which determines the inclination between the movement reference axes of the moving mechanism 14 and the measurement reference axes of the offset measuring camera 18, a second inclination calculating section 52 which determines the inclination between the imaging reference axes of the position detection camera 24 and the measurement reference axes of the offset measuring camera 18, and a moving mechanism control section 54 which controls the movement of the moving mechanism 14.

Figure 2:
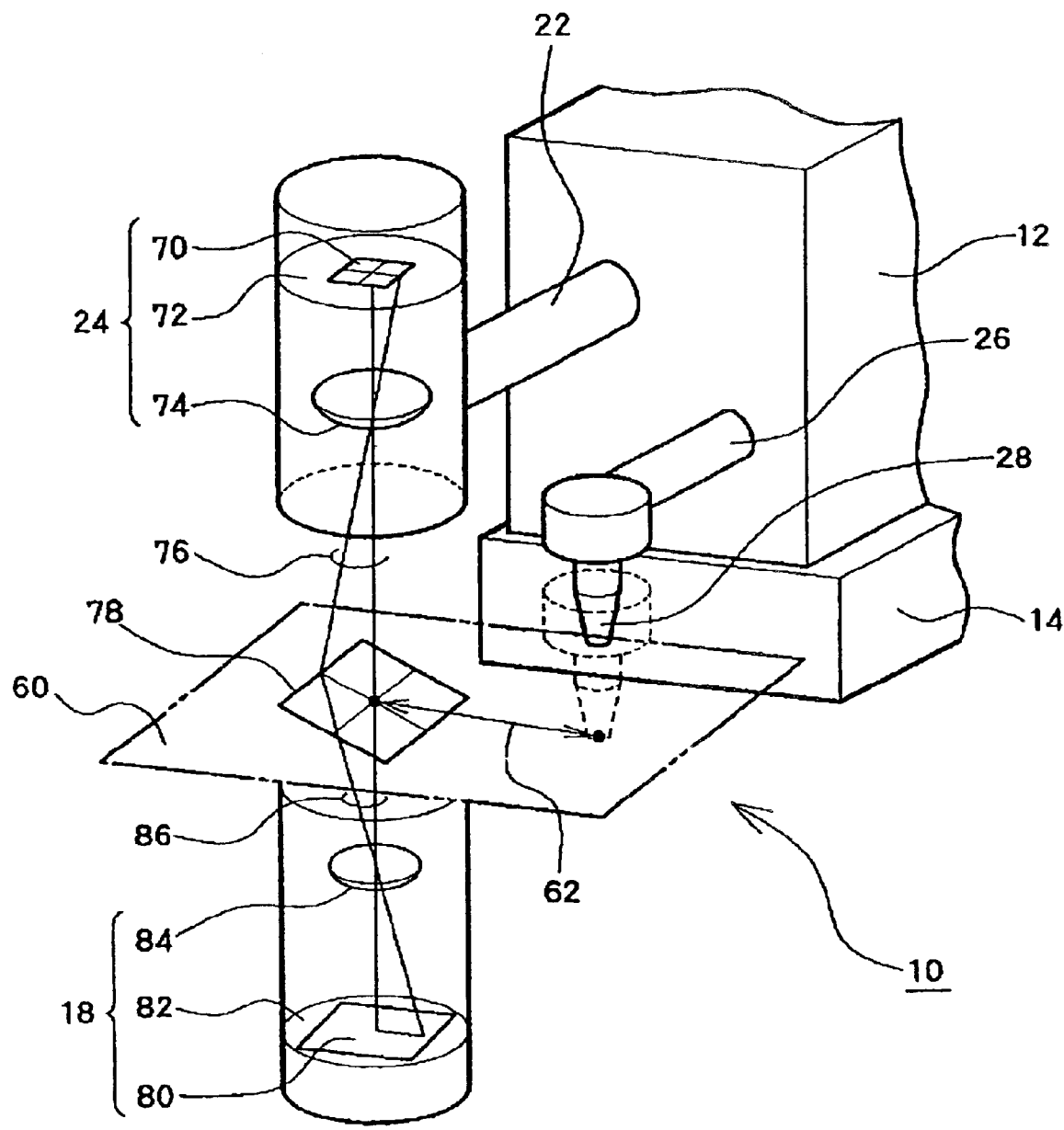
FIG. 2 is a partial perspective view of the bonding apparatus equipped with the offset adjustment mechanism of the embodiment of the present invention, showing the manner of offset measurement in schematic terms.

FIG. 2 is a partial perspective view of the bonding apparatus 10, showing the conditions of offset measurement in schematic terms. In FIG. 2, the conveying mechanism is omitted, and the bonding working plane 60 corresponding to the surface of the part that is to be bonded is indicated by two-dot chain lines. The conveying device may be retracted during offset measurement; instead, a system can be used in which the position detection camera 24 is disposed in such a position that this camera does not interfere with the conveying device, and the conveying device is not retracted even during offset measurement.

The object plane of the position detection camera 24 is set so that this object plane coincides with the bonding working plane 60; and when bonding work is performed, the bonding tool 28 is set so that the tip end of this bonding tool is lowered to the bonding working plane 60. As shown in FIG. 2, the position detection camera 24 and bonding tool 28 have an offset 62, and they are disposed on the same side of the bonding working plane 60. The offset measuring camera 18 is, on the other hand, disposed on the opposite side of the bonding working plane 60.

The position detection camera 24 is an imaging camera, and it faces the bonding working plane. The position detection camera 24 includes (inside a cylindrical lens barrel) an imaging plane 72, on which a plurality of imaging elements 70 are disposed in two dimensions, and an optical lens 74, whose image plane is the imaging plane 72 and whose object plane is the bonding working plane 60.

Here, the term "object plane" refers to the object plane in an optical system, and it indicates the plane where (it is assumed that) the object being observed will be disposed (when the optical system is designed). In other words, if a point light source is disposed on the object plane, the light emitted from this light source will be focused on the imaging plane as a point image with a size that satisfies the design specifications of the optical system; and thus by way of disposing the object of observation on the object plane, observation with the best precision is possible.

The optical lens 74 can be a single lens; however, it can be constructed from an optical system that combines a plurality of optical elements such as lenses and filters, etc. The optical lens 74 functions to form an image 78 of the plurality of imaging elements 70 (on the imaging plane 72) on the bonding working plane 60 via the light path 76.

The offset measuring camera 18 is installed separately from the position detection camera 24 and faces the bonding working plane 60. The object plane of the offset measuring camera 18 is set on the bonding working plane 60. The offset measuring camera 18 comprises (inside a cylindrical lens barrel) an imaging plane 82, on which a plurality of imaging elements 80 disposed in two dimensions are installed, and an optical lens 84, whose image plane is the imaging plane 82 and whose object plane is the bonding working plane 60.

The optical lens 84 can be a single lens, and it can be constructed from an optical system that combines a plurality of optical elements such as lenses and filters, etc. The optical lens 84 functions to project an image that is formed on the bonding working plane 60 onto the imaging plane 82 of the offset measuring camera 18 via the light path 86.

In the shown embodiment, the image 78 of the plurality of imaging elements 70 of the position detection camera 24 that is formed on the bonding working plane 60 is projected onto the imaging plane 82 of the offset measuring camera 18 and detected by the imaging element 80.

Figure 3:
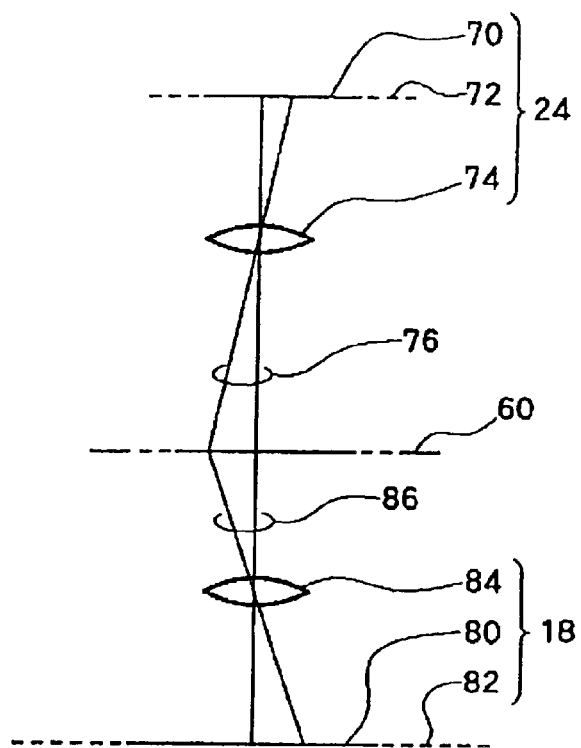
FIG. 3 is a diagram showing the manner of detecting the imaging elements of the position detection camera by the offset measuring camera in the embodiment of the present invention.

FIG. 3 illustrates, in terms of the optical path, how the imaging elements of the position detection camera 24 are detected by the offset measuring camera 18.

First, the bonding head 12 is moved by the moving mechanism, so that the position detection camera 24 is moved into the visual field, i.e., the measurement range, of the offset measuring camera 18. In this state, as shown FIG. 3, the optical path of the optical lens 74 of the position detection camera 24 is set so that the image plane is at the imaging plane 72 and so that the object plane is at the bonding working plane 60. Accordingly, the image of the imaging elements 70 on the imaging plane 72 is focused on the bonding working plane 60 by the optical lens 74 via the light path 76. On the other hand, the optical path of the optical lens 84 of the offset measuring camera 18 is set so that the image plane is at the imaging plane 82 and so that the object plane is at the bonding working plane. Accordingly, the image on the bonding working plane 60 is projected onto the imaging elements 80 via the light path 86 of the optical lens 84. Thus, since the two cameras 24 and 18 are disposed so that the object planes thereof of are coincide and thus are both at the bonding working plane 60, the image (70) of the imaging elements of the position detection camera 24 is detected by the imaging elements 80 of the offset measuring camera 18.

Figure 4:
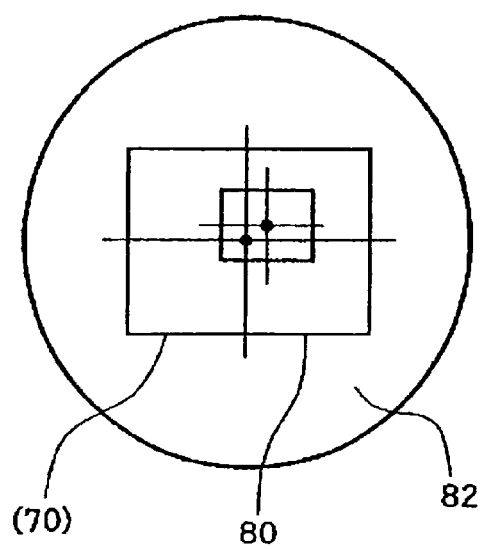
FIG. 4 is a diagram showing the manner of projecting the image of the imaging elements of the position detection camera onto the imaging elements of the offset measuring camera in the embodiment of the present invention.

FIG. 4 shows how the image (70) of the imaging elements of the position detection camera 24 is projected onto the imaging elements 80 within the imaging plane 82 of the offset measuring camera 18.

Figure 5:
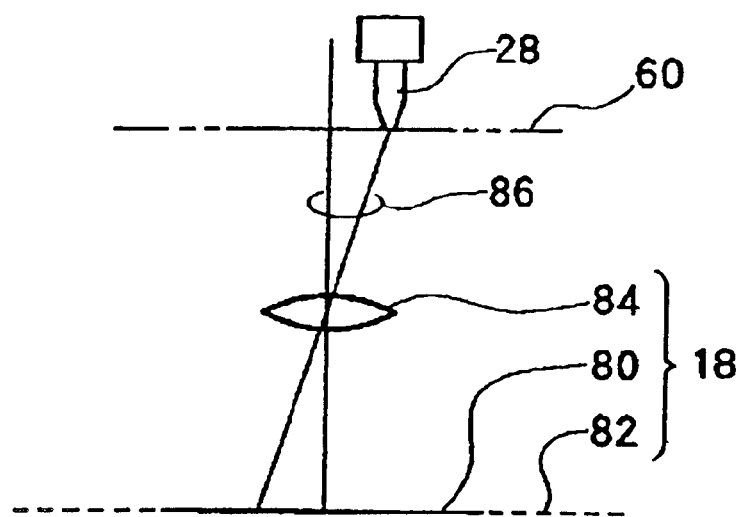
FIG. 5 is a diagram showing the manner of detecting the tip end of the bonding tool by the offset measuring camera in the embodiment of the present invention.

FIG. 5 illustrates how the tip end of the bonding tool 28 is detected by the offset measuring camera 18 in terms of the optical path.

First, the bonding head (12) is moved by the moving mechanism, so that the bonding tool 28 is moved into the visual field, i.e., the measurement range, of the offset measuring camera 18, and the bonding arm is lowered so that the tip end of the bonding tool 28 reaches the bonding working plane 60. As described above, the optical path of the optical lens 84 of the offset measuring camera 18 is set so that the image plane is at the imaging plane 82, and so that the object plane is at the bonding working plane. Accordingly, the image of the tip end of the bonding tool 28 on the bonding working plane 60 is formed on the imaging elements 80 via the light path 86 of the optical lens 84. Thus, since the tip end of the bonding tool 28 is caused to coincide with the object plane of the offset measuring camera 18, the image (28) of the tip end of the bonding tool can be detected by the imaging elements 80 of the offset measuring camera 18.

Figure 6:
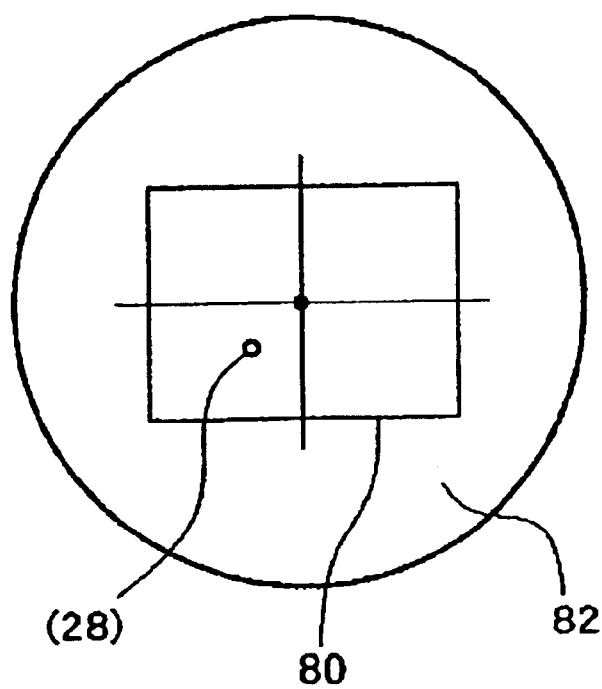
FIG. 6 is a diagram showing the manner of projecting the tip end of the bonding tool onto the imaging elements of the offset measuring camera in the embodiment of the present invention.

FIG. 6 shows how the tip end of the bonding tool 28 is projected onto the imaging elements 80 within the imaging plane 82 of the offset measuring camera 18.

In the above, though the object plane of the optical lens 74 and the object plane of the optical lens 84 coincide, it is possible to use an object-side telecentric optical system instead of such an optical lens 74 and optical lens 84.

The term "object-side telecentric lens" or "object-side telecentric optical system" refers to an optical system in which the principal light rays that are focused as an image pass through a focal point on the back side of the lens. Such optical systems have a broad tolerance range for positional deviation in the direction facing the focal plane and are known for the fact that the size of the image, i.e., the distance from the optical axis, does not vary even if the object position fluctuates in cases where the object is illuminated by transmitted light that is parallel light. By way of using such an object-side telecentric optical system, images are detected by the offset measuring camera 18 with almost no variation in the size of the images (70 and 28) that are to be detected, even if the relative positions of the position detection camera 24 and offset measuring camera 18 fluctuate with respect to the bonding working plane 60.

Figure 7:
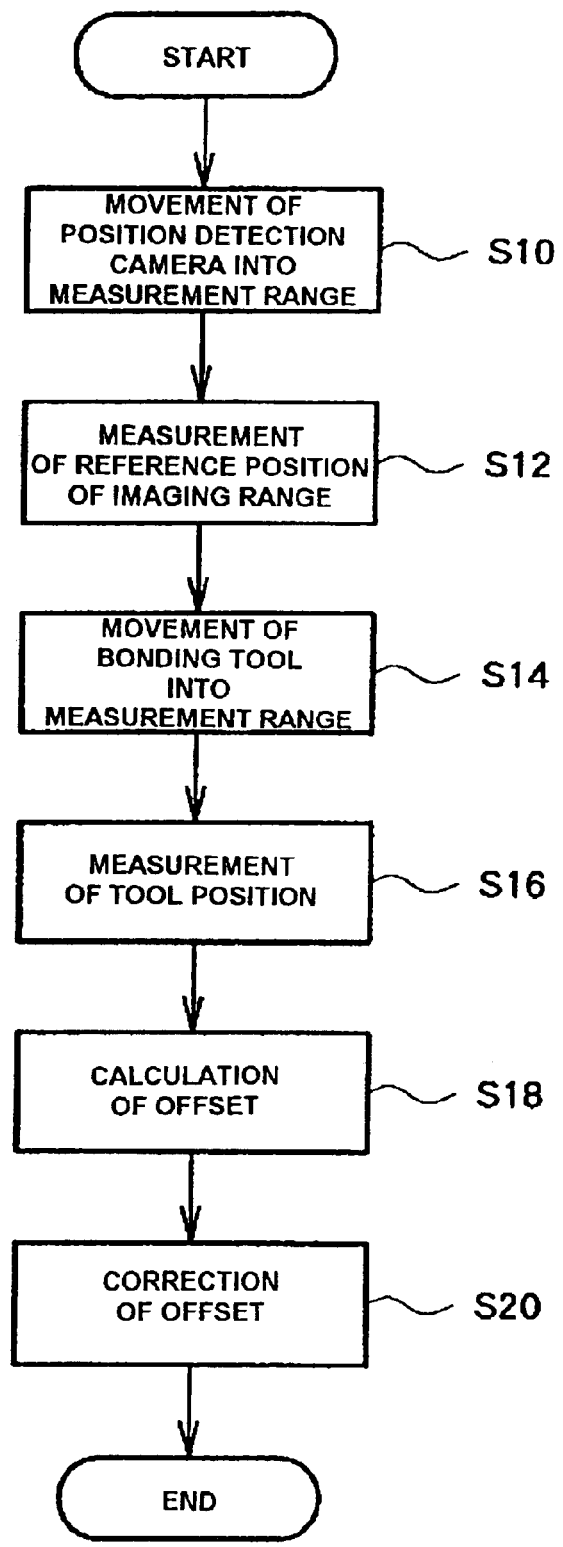
FIG. 7 is a flow chart of offset measurement in the embodiment of the present invention.

Next, the method to measure the offset between the position detection camera 24 and the bonding tool 28 using the offset measuring camera 18 in the above-described structure will be described with reference FIG. 7, which is a flow chart, and FIG. 8, which shows the conditions of the image on the imaging elements 80 of the offset measuring camera 18.

First, the position detection camera 24 is moved into the measurement range of the offset measuring camera 18 (S10). This movement is accomplished by controlling the moving mechanism 14 by means of the moving mechanism control section 54 of the control block 20. In this state, the image (70) of the imaging elements within the imaging plane 72 of the position detection camera 24 is projected as shown in FIG. 8 onto the imaging elements 80 of the imaging plane 82 of the offset measuring camera 18. The projected image is detected by the imaging elements 80, and the resulting data is input into the imaging position measuring section 42 of the control block 20.

Next, the reference position of the imaging range of the position detection camera 24 is measured in the imaging position measuring section 42 (S12). Since the imaging range of the position detection camera 24 constitutes the positions where the imaging elements 70 are disposed in two dimensions, the center position, for example, of the imaging elements 70 disposed in two dimensions can be taken as the reference position of the imaging range. The reference position can be determined by a correspondence calculation such as an operation in which some other easily recognizable position of the imaging elements 70, e.g., the position of the lower left corner point, etc., is measured, and the center position of the imaging elements is calculated based upon the overall dimensions of the imaging elements disposed in two dimensions, which are known beforehand, and the magnification of the position detection camera 24.

Figure 8:
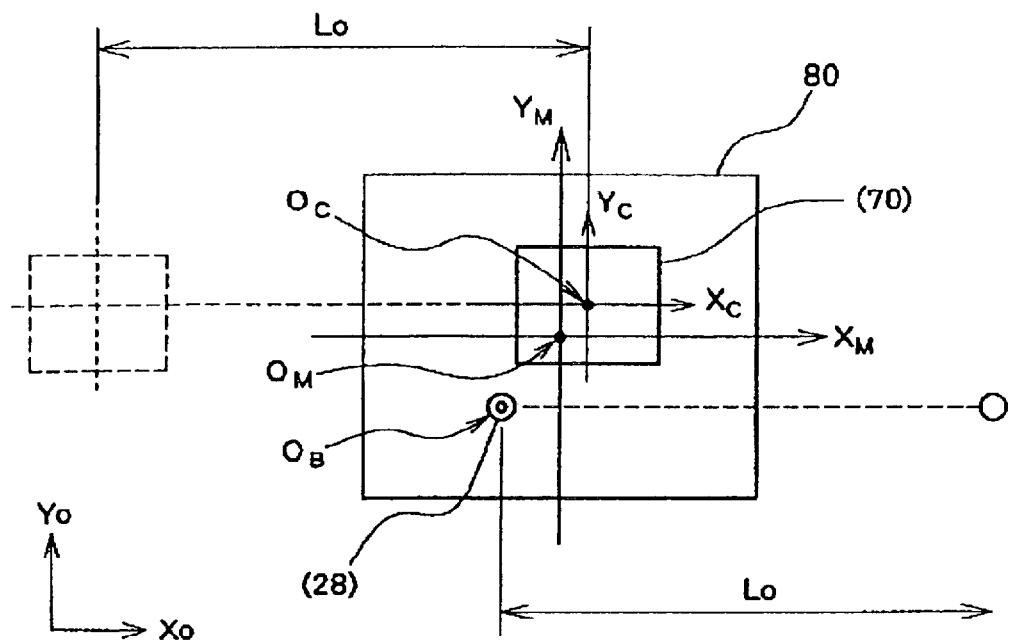
FIG. 8 is a diagram showing the manner of the image on the imaging elements of the offset measuring camera in offset measurement of the embodiment of the present invention.

In FIG. 8, the movement reference axes of the moving mechanism 14 are designated as $X_O$ and $Y_O$, the measurement reference axes of the offset measuring camera 18 are designated as $X_M$ and $Y_M$, and the imaging reference axes of the imaging plane of the position detection camera 24 that are projected are designated as $X_C$ and $Y_C$. It is assumed that the disposition reference axes $X_D$ and $Y_D$ of the imaging elements in the imaging plane of the position detection camera 24 coincide with the imaging reference axes $X_C$ and $Y_C$. Here, if the origin of the measurement reference axes of the offset measuring camera 18 is designated as $O_M$, and the origin of the disposition reference axes for the image (70) of the imaging elements of the position detection camera 24 that is projected is designated as $O_C$, then the reference position of the position detection camera 24 for the measurement reference axes $X_M$ and $Y_M$ can be measured by ($O_C$–$O_M$). The measured reference position of the position detection camera 24 is input into the offset calculating section 46 of the control block 20.

Next, the bonding tool 28 is moved into the measurement range of the offset measuring camera 18 (S14). The moving mechanism 14 is controlled by the moving mechanism control section 54 so that the bonding tool 28 is moved by a nominal offset $L_O$ along the movement reference axis $Y_O$ of the moving mechanism 14. Here, the term "nominal offset $L_O$" refers to a nominal distance set between the bonding tool 18 and the position detection camera using the position detection camera 24 as a reference. In this state, the image (28) of the tip end of the bonding tool 28 is projected as shown in FIG. 8 onto the imaging elements 80 of the imaging plane 82 of the offset measuring camera 18. The projected image is detected by the imaging elements 80, and this data is input into the tool position measuring section 44 of the control block 20.

Next, in the tool position measuring section 44, the tool position of the bonding tool 28 is measured (S16). In FIG. 8, if $O_B$ is taken as the center point of the projected image (28) of the tip end of the bonding tool, then the tool position is measured for the measurement reference axes $X_M$, $Y_M$ by means of ($O_B$–$O_M$). The measured tool position is input into the offset calculating section 46 of the control block 20.

The order of the steps S10 and S12 and the steps S14 and S16 can be reversed. In either case, the measurement results for the reference position of the imaging range in the position detection camera 24 and the measurement results for the tool position are input into the offset calculating section 46, and the actual offset L is calculated based upon these results (S18). The actual offset L can be calculated by converting the reference position ($O_C$–$O_M$) of the position detection camera 24 for the measurement reference axes $X_M$, $Y_M$, the tool position ($O_B$–$O_M$) and the nominal offset $L_O$ into values using the movement reference axes $X_O$, $Y_O$ as a reference.

The simplest case will be described in which it is assumed that, for instance, the movement reference axes $X_O$, $Y_O$, the disposition reference axes $X_D$, $Y_D$ and the movement reference axes $X_M$, $Y_M$ all coincide, the magnification of the position detection camera 24 is 1×, and the magnification of the offset measuring camera 18 is also 1×. In this case, since all of the coordinate systems coincide, if ($O_C$–$O_M$), ($O_B$–$O_M$) and $L_O$ are taken as vectors, then the offset L expressed by these vectors is given by $L_O$+($O_B$–$O_M$). From this, the offset correction (S20) is given by $L$–$L_O$=($O_B$–$O_M$).

In actuality, in the case of ($O_C$–$O_M$), correction of the inclination of the imaging reference axes $X_C$, $Y_C$ with respect to the measurement reference axes $X_M$, $Y_M$, the inclination of the disposition reference axes $X_D$, $Y_D$ with respect to the imaging reference axes $X_C$, $Y_C$, the magnification of the position detection camera 24 and the magnification of the offset measuring camera 18 is necessary; and in the case of ($O_B$–$O_M$), correction of the inclination of the measurement reference axes $X_M$, $Y_M$ with respect to the movement reference axes $X_O$, $Y_O$ and the magnification of the offset measuring camera 18 is necessary. The calculation of the inclinations between these respective reference axes, and the calculation of the magnifications, will be described later.

Figure 9:
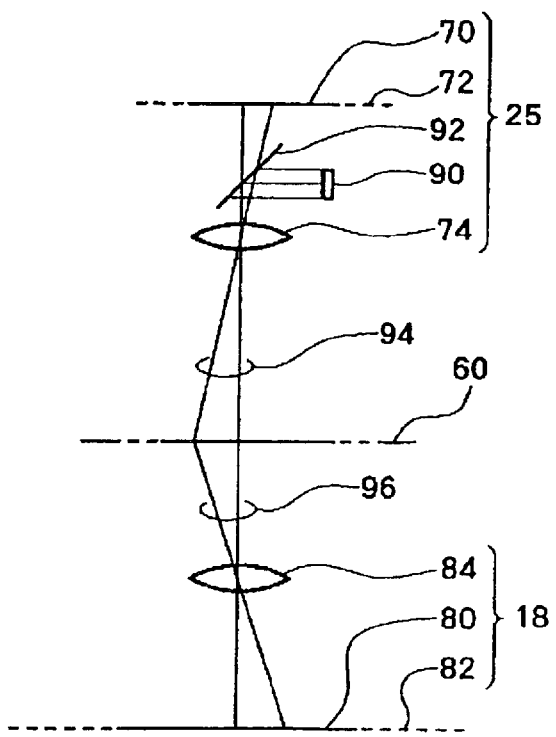
FIG. 9 is a diagram showing the manner of detecting the reference position of the imaging range of the position detection camera by the offset measuring camera in another embodiment of the present invention.

FIG. 9 illustrates, in terms of the optical path, how the reference position of the imaging range of the position detection camera 25 is detected by the offset measuring camera 18 in another embodiment of the present invention.

As seen from FIG. 9, the position detection camera 25 includes a measurement reference member 90 and a half-mirror 92. The measurement reference member 90 is disposed in a reference member disposition position which is associated with a reference position of the imaging range within the imaging plane 72 of the position detection camera 25, e.g., the center position of the imaging elements 70 and which is on a plane that differs from the imaging plane 72 of the position detection camera 25. For example, the reference member disposition position is set so that the light path length from the imaging elements 70 to the half-mirror 92 is equal to the light path length from the measurement reference member 90 to the half-mirror 92. Furthermore, the image of the measurement reference member 90 disposed in the reference member disposition position is projected toward the bonding working plane 60 by the half-mirror 92 via the light path 94.

Since the optical path of the optical lens 84 of the offset measuring camera 18 is set so that its image plane is at the imaging plane 82 and its object plane is at the bonding working plane as described above, the image of the measurement reference member 90 that is projected onto the bonding working plane 60 is projected onto the imaging elements 80 via the light path 96 of the optical lens 84.

Figure 10:
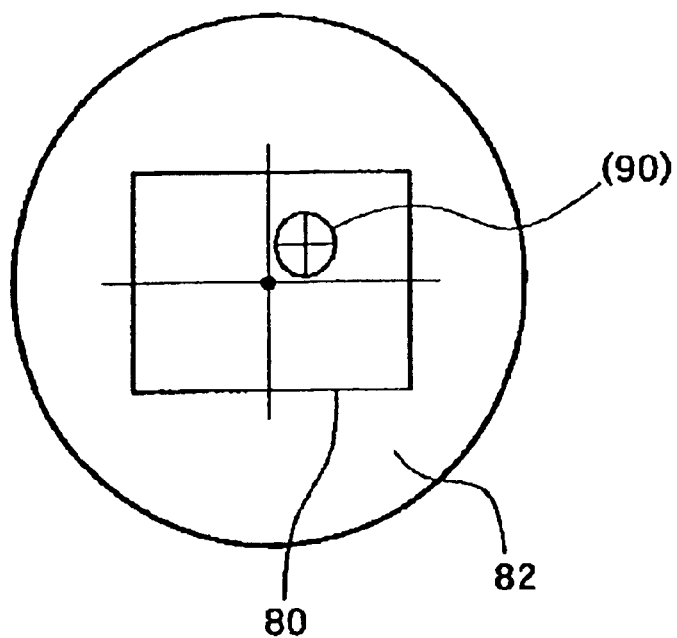
FIG. 10 is a diagram showing the manner of projecting the image of the measurement reference member onto the imaging elements of the offset measuring camera in another embodiment of the present invention.

FIG. 10 shows how the image (90) of the measurement reference member 90 is projected onto the imaging elements 80 within the imaging plane 82 of the offset measuring camera 18.

The projected image (90) of the measurement reference member 90 is input into the imaging position measuring section 42 of the control block 20 (see FIG. 1) and is converted into the reference position of the imaging range of the position detection camera 24 based upon the correspondence between the measurement reference member 90 and the center position of the imaging elements.

Thus, even in cases where the image within the imaging plane of the position detection camera is, for example, amorphous and the reference position of the imaging range of the position detection camera is difficult to measure with accuracy in the case of the method illustrated in FIGS. 3 and 4, the reference position of the imaging range of the position detection camera 24 can be accurately measured by detecting an image of the measurement reference member.

The actual magnification of the offset measuring camera 18 is measured in the following manner: First, the bonding tool 28 is moved into the measurement range of the offset measuring camera 18. This step can be accomplished by the same procedure as in the case of S14 in FIG. 7. In this state, the image (28) of the tip end of the bonding tool is projected as shown in FIG. 8 onto the imaging elements 80 of the imaging plane 82 of the offset measuring camera 18. Then, the bonding tool 28 is further moved a specified distance by the moving mechanism 14. This specified distance is designated as $d_O$. The amount of movement $d_i$ of the image (28) of the bonding tool on the imaging elements 80 of the offset measuring camera 18 corresponding to the above-described amount of movement is measured. These values are input into the first magnification calculating section 48 of the control block 20. In the first magnification calculating section 48, $n_1 = d_i/d_O$ is calculated; the obtained value is taken as the magnification of the offset measuring camera 18 and is used for calculations in the offset calculating section 46, etc.

The actual magnification of the position detection camera 24 is measured in the following manner: First, the position detection camera 24 is moved into the measurement range of the offset measuring camera 18. This step can be accomplished by the same procedure as in the case of S10 in FIG. 7. In this state, the image (70) of the imaging elements 70 in the imaging plane 72 of the position detection camera 24 is projected as shown in FIG. 8 onto the imaging elements 80 of the imaging plane 82 of the offset measuring camera 18. The dimension of the image (70) of the imaging elements, e.g., the longitudinal dimension $c_1$, is measured by the offset measuring camera 18. The actual longitudinal dimension $c_O$ of the imagine elements 70 disposed in two dimensions is predetermined and thus known in advance. The magnification $n_1$ of the offset measuring camera 18 is calculated as described above. These values are input into the second magnification calculating section 49 of the control block 20. In the second magnification calculating section 49, $n_2 = (c_O * n_1)/c_1$ is calculated; the obtained value is taken as the magnification of the position detection camera 24 and is used for calculations by the offset calculating section 46, etc.

Furthermore, the actual magnification of the position detection camera 24 can be measured using the measurement reference member 90 illustrated in FIG. 9. In this case, the position detection camera 24 is first moved into the measurement range of the offset measuring camera 18. This step can be accomplished by the same procedure as in the case of S10 in FIG. 7. In this state, the image (90) of the measurement reference member 90 contained in the position detection camera 24 is projected onto the imaging elements 80 of the imaging plane 82 of the offset measuring camera 18. The dimension, e.g., the diameter dimension $b_1$, of the measurement reference member 90 is measured by the offset measuring camera 18. The actual diameter dimension $b_O$ of the measurement reference member 90 is predetermined and thus known in advance, and the magnification $n_1$ of the offset measuring camera 18 is also calculated as described above. These values are input into the second magnification calculating section 49 of the control block 20. In the second magnification calculating section 49, $n_2 = (b_O * n_1)/b_1$ is calculated; the obtained value is taken as the magnification of the position detection camera 24 and is used for calculations by the offset calculating section 46, etc.

Figure 11:
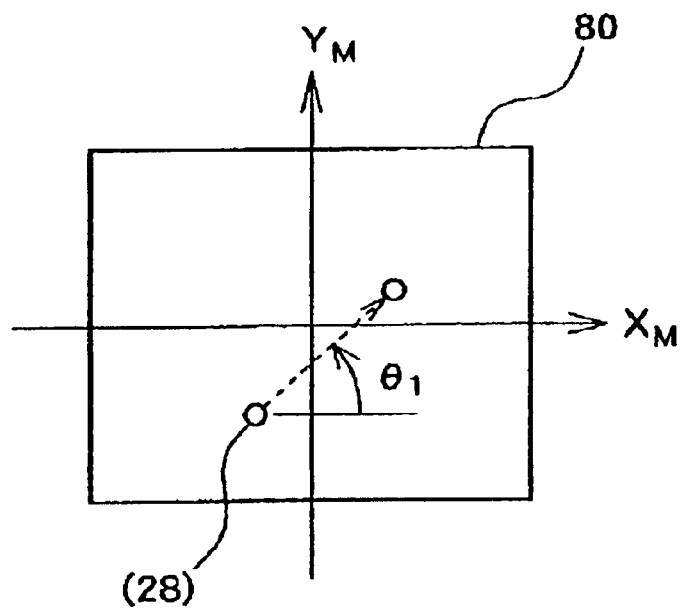
FIG. 11 is a diagram showing the manner of determining the inclination between the movement reference axes and the measurement reference axes in the embodiment of the present invention.

FIG. 11 shows how the inclination between the movement reference axes $X_O$, $Y_O$ and the measurement reference axes $X_M$, $Y_M$ is determined.

First, the bonding tool 28 is moved into the measurement range of the offset measuring camera 18. In this state, the image (28) of the tip end of the bonding tool 28 is projected as shown in FIG. 11 onto the imaging elements 80 of the imaging plane 82 of the offset measuring camera 18. This procedure is the same as the process of S14 in FIG. 7 or the same as the first portion of the above-described process that determines the magnification. Next, the bonding tool 28 is moved in one direction, e.g., the direction of $X_O$, of the movement reference axes. The direction of movement of the image (28) of the tip end of the bonding tool in this case is shown by broken lines in FIG. 11.

The bearing (direction) of this movement direction with respect to the measurement reference axes $X_M$, $Y_M$ is measured and input into the first inclination calculating section 50 of the control block 20. In the first inclination calculating section 50, the bearing of the movement direction is calculated, and the inclination between the movement reference axes $X_O$, $Y_O$ and measurement reference axes $X_M$, $Y_M$ is supplied as $\theta_1$ for calculations by the offset calculating section 46, etc.

Figure 12:
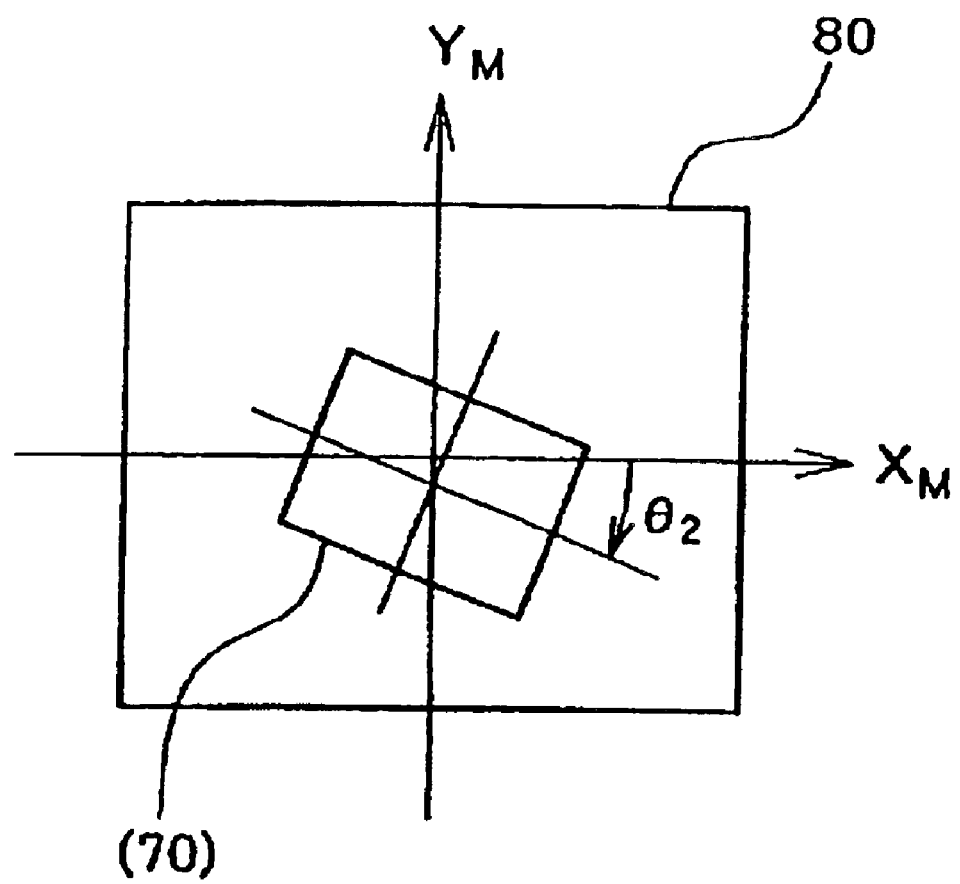
FIG. 12 is a diagram showing the manner of determining the inclination between the measurement reference axes and the disposition reference axes in the embodiment of the present invention.

FIG. 12 shows how the inclination between the measurement reference axes $X_M$, $Y_M$ and the disposition reference axes $X_D$, $Y_D$ is determined.

In actuality, there is an inclination of the imaging reference axes $X_C$, $Y_C$ with respect to the measurement reference axes $X_M$, $Y_M$ and an inclination of the disposition reference axes $X_D$, $Y_D$ with respect to the imaging reference axes $X_C$, $Y_C$; however, since the latter inclination is known in advance, determination of the inclination between the measurement reference axes $X_M$, $Y_M$ and the disposition reference axes $X_D$, $Y_D$ is sufficient for the calculation of the offset.

First, the position detection camera 24 is moved into the measurement range of the offset measuring camera 18. This step can be accomplished by the same procedure as in the case of S10 in FIG. 7. In this state, the image (70) of the imaging elements within the imaging plane 72 of the position detection camera 24 is projected as shown in FIG. 12 onto the imaging elements 80 of the imaging plane 82 of the offset measuring camera 18.

Here, the inclination of the disposition reference axes of the imaging elements is measured with respect to the measurement reference axes $X_M$, $Y_M$ and is input into the second inclination calculating section 52 of the control block 20. In the second inclination calculating section 52, the inclination angle is measured; and the inclination between the measurement reference axes $X_M$, $Y_M$ and the disposition reference axes $X_D$, $Y_D$ is supplied as $\theta_2$ for calculations by the offset calculating section 46, etc.

As seen from the above offset measuring mechanism and offset measuring method of the present invention, the bonding tool and the position detection camera are offset with reference to each other and such an offset is measured in a stable fashion over a long period of time.

What is claimed is:

1. An offset measuring mechanism in a bonding apparatus that includes:
   a position detection camera that detects the position of a part to be bonded on a bonding working plane,
   a bonding tool that is disposed with an offset from said position detection camera, and
   a moving means for moving said position detection camera and said bonding tool as an integral unit on a plane parallel to said bonding working plane,
   wherein said offset measuring mechanism that measures said offset comprises:
   an offset measuring camera which is disposed on an opposite side of said bonding working plane from said position detection camera and said bonding tool and which faces said bonding working plane;
   an imaging position measuring means which uses said moving means to move said position detection camera into a measurement range of said offset measuring camera and determines a reference position of an imaging range in an imaging plane of said position detection camera based upon measurement of said imaging plane of said position detection camera by said offset measuring camera;
   a tool position measuring means which uses said moving means to move said bonding tool into said measurement range of said offset measuring camera and measures a tool position of said bonding tool with said offset measuring camera; and
   an offset calculating means which calculates said offset based upon a measured value of said determined reference position of said imaging range and a measured value of said tool position; and
   said position detection camera has a plurality of imaging elements disposed in two dimensions in directions of mutually perpendicular element disposition axes which are associated with mutually perpendicular imaging reference axes of said imaging plane; and
   said reference position of said imaging range is a reference position of said two-dimensional disposition of said plurality of imaging elements.

2. The offset measuring mechanism according to claim 1, wherein an object plane of said position detection camera and an object plane of said offset measuring camera coincide.

3. The offset measuring mechanism according to claims 1, wherein said offset measuring camera has an object side telecentric optical system.

4. The offset measuring mechanism according to claims 1, further comprising an offset measuring camera magnification calculating means, wherein said offset measuring camera magnification calculating means:
   uses said moving means to move said bonding tool into said measurement range of said offset measuring camera and to further move said bonding tool within said measurement range so as to measure an amount of movement of an image of said bonding tool on said imaging plane of said offset measuring camera corresponding to said amount of movement; and
   calculates magnification of said offset measuring camera based upon an amount of movement of said bonding tool and an amount of movement of said image of said bonding tool.

5. The offset measuring mechanism according to claim 1, further comprising a position detection camera magnification calculating means, wherein said position detection camera magnification calculating means:
   uses said moving means to move said bonding tool into a measurement range of said offset measuring camera; and
   calculates a magnification of said position detection camera based upon measurement of predetermined dimensions of said plurality of imaging elements by said offset measuring camera.

6. The offset measuring mechanism according to claims 1, further comprising an offset measuring camera inclination calculating means, wherein said offset measuring camera inclination calculating means:
   uses said moving means to move said bonding tool into a measurement range of said offset measuring camera and to further move said bonding tool within said measurement range;
   measures a movement direction of an image of said bonding tool on said imaging plane of said offset measuring camera corresponding to said movement relative to mutually perpendicular measurement reference axes on said imaging plane of said offset measuring camera; and
   calculates a relative inclination between movement reference axes of said moving means and measurement reference axes of said offset measuring camera based upon a movement direction of said bonding tool relative to mutually perpendicular movement reference axes of said moving means and a movement direction of an image of said bonding tool.

7. The offset measuring mechanism according to claim 1, further comprising a position detection camera inclination calculating means, wherein said position detection camera inclination calculating means:

uses said moving means to move said position detection camera into a measurement range of said offset measuring camera, and calculates a relative inclination of imaging reference axes of said position detection camera and measurement reference axes of said offset measuring camera based upon measurement of inclination of said element disposition axes relative to mutually perpendicular measurement reference axes in said imaging plane of said offset measuring camera.

8. An offset measuring mechanism in a bonding apparatus that includes:

a position detection camera that detects the position of a part to be bonded on a bonding working plane, a bonding tool that is disposed with an offset from said position detection camera, and a moving means for moving said position detection camera, and said bonding tool as an integral unit on a plane parallel to said bonding working plane, wherein said offset measuring mechanism that measures said offset comprises:

an offset measuring camera which is disposed on an opposite side of said bonding working plane from said position detection camera and said bonding tool and which faces said bonding working plane;

an imaging position measuring means which uses said moving means to move said position detection camera into a measurement range of said offset measuring camera and determines a reference position of an imaging range in an imaging plane of said position detection camera based upon measurement of said imaging plane of said position detection camera by said offset measuring camera;

a tool position measuring means which uses said moving means to move said bonding tool into said measurement range of said offset measuring camera and measures a tool position of said bonding tool with said offset measuring camera; and an offset calculating means which calculates said offset based upon a measured value of said determined reference position of said imaging range and a measured value of said tool position; and further comprising an offset measuring camera inclination calculated means, wherein said offset measuring camera inclination calculated means:

uses said moving means to move said bonding tool into a measurement range of said offset measuring camera and to further move said bonding tool within said measurement range;

measures a movement direction of an image of said bonding tool on said imaging plane of said offset measuring camera corresponding to said movement relative to mutually perpendicular measurement reference axes on said imaging plane of said offset measuring camera; and calculates a relative inclination between movement reference axes of said moving means and measurement reference axes of said offset measuring camera based upon a movement direction of said bonding tool relative to mutually perpendicular movement reference axes of said moving means and a movement direction of an image of said bonding tool.

* * * * *